(12) United States Patent
Cowley et al.

(10) Patent No.: US 8,823,568 B2
(45) Date of Patent: Sep. 2, 2014

(54) METHODS AND ARRANGEMENTS FOR HIGH-SPEED DIGITAL-TO-ANALOG CONVERSION

(71) Applicants: Nicholas P. Cowley, Wroughton (GB); Isaac Ali, Bristol (GB)

(72) Inventors: Nicholas P. Cowley, Wroughton (GB); Isaac Ali, Bristol (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/631,858

(22) Filed: Sep. 28, 2012

(65) Prior Publication Data

US 2014/0091958 A1    Apr. 3, 2014

(51) Int. Cl.
*H03M 1/66* (2006.01)
(52) U.S. Cl.
USPC ............................................ 341/144; 375/295
(58) Field of Classification Search
USPC ......................................................... 341/144
See application file for complete search history.

(56) References Cited

U.S. PATENT DOCUMENTS

| 4,591,832 | A  | * | 5/1986  | Fling et al. ................ 341/141 |
| 7,079,058 | B2 | * | 7/2006  | Efland et al. .............. 341/110 |
| 7,221,300 | B2 | * | 5/2007  | Fontaine et al. ........... 341/136 |
| 7,312,737 | B2 | * | 12/2007 | Jungerman et al. ........ 341/141 |

* cited by examiner

*Primary Examiner* — Khai M Nguyen
(74) *Attorney, Agent, or Firm* — Schubert Law Group PLLC

(57) ABSTRACT

Embodiments may comprise logic such as hardware and/or code for high-speed digital-to-analog conversion of signals. Many embodiments comprise a demultiplexer to distribute sets of bits to digital-to-analog converters, the digital-to-analog converters to receive the sets of bits and the operate concurrently to convert the sets of bits from digital representations of signal segments to output analog signal segments, and an interleaver to interleave the analog signal segments from each of digital-to-analog converters in the sequence to generate an analog signal. In many embodiments, the interleaver is adapted to interleave the analog signal segments by latching magnitudes of each of the analog signal segments to an interleaved output near ends of clock cycles to attenuate non-linearities in the magnitudes of each of the analog signal segments when the magnitudes are output.

23 Claims, 4 Drawing Sheets

METHODS AND ARRANGEMENTS FOR HIGH-SPEED DIGITAL-TO-ANALOG CONVERSION

BACKGROUND

The present disclosure relates generally to the field of communications technologies. More particularly, the present disclosure relates to high-speed digital to analog conversion of signals.

DETAILED DESCRIPTION OF EMBODIMENTS

Figure 1:
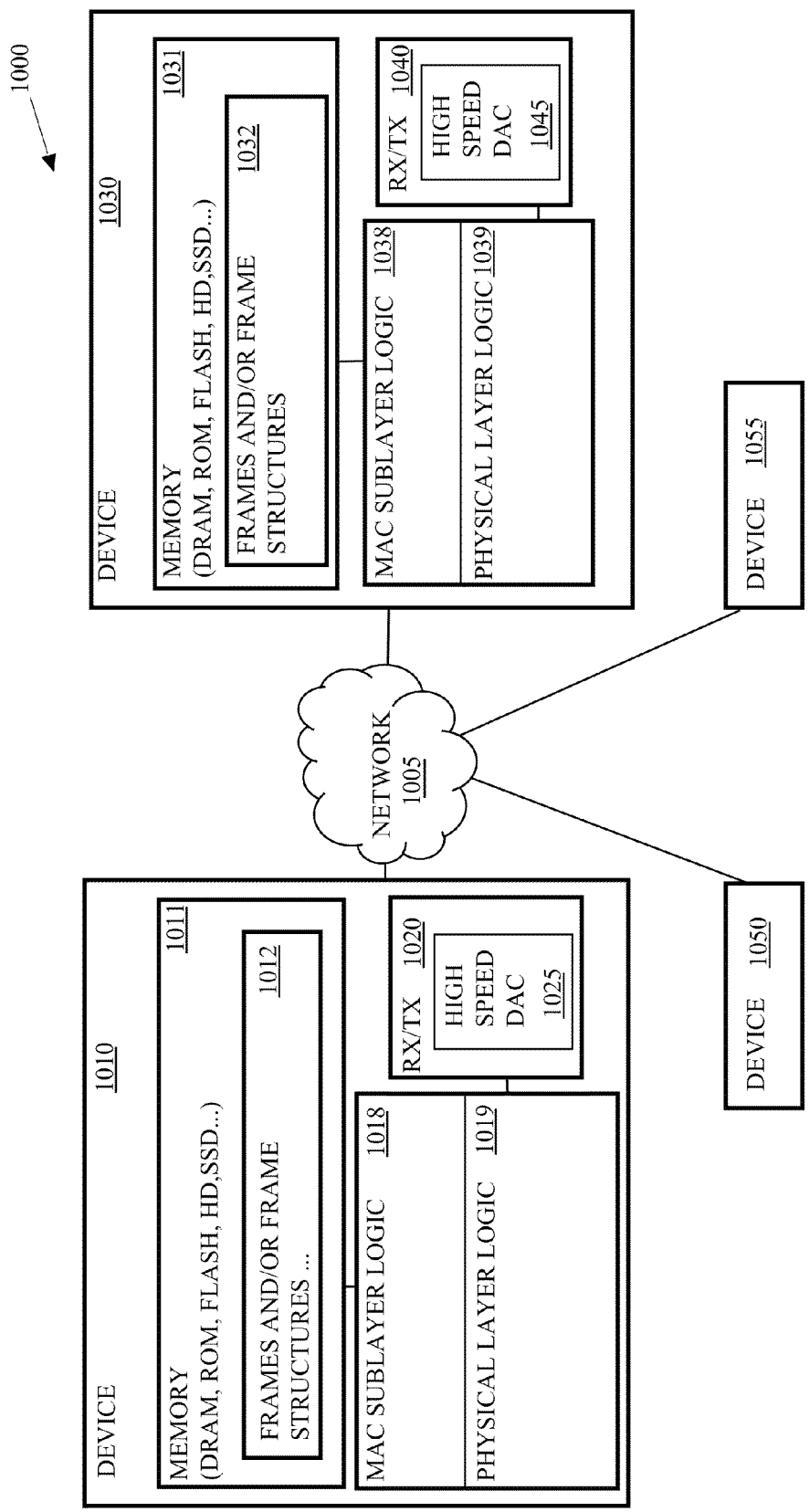
FIG. 1 depicts an embodiment of a network comprising a plurality of communications devices, including multiple fixed or mobile communications devices.

The following is a detailed description of novel embodiments depicted in the accompanying drawings. However, the amount of detail offered is not intended to limit anticipated variations of the described embodiments; on the contrary, the claims and detailed description are to cover all modifications, equivalents, and alternatives as defined by the appended claims. The detailed descriptions below are designed to make such embodiments understandable and obvious to a person having ordinary skill in the art.

Generally, embodiments for high-speed digital-to-analog conversion of signals are described herein. Embodiments may comprise logic such as hardware and/or code for high-speed digital-to-analog conversion of a digital data stream. Many embodiments receive the data stream at an element designed to distribute sets of bits from the data stream to multiple digital-to-analog converters (DACs) also referred to herein as sub-DACs since each of the sub-DACs may be designed to convert a portion of the data stream. Many embodiments comprise a demultiplexer to distribute the sets of bits to the digital-to-analog converters. In several embodiments, the digital-to-analog converters receive the sets of bits and operate concurrently to convert the sets of bits from digital representations of signal segments to output analog signal segments. Further embodiments comprise an interleaver to interleave the analog signal segments from each of digital-to-analog converters in the sequence to generate an analog signal. In several embodiments, the interleaver is adapted to interleave the analog signal segments by latching magnitudes of each of the analog signal segments to an interleaved output near ends of clock cycles to attenuate non-linearities in the magnitudes of each of the analog signal segments. In further embodiments, the interleaver may interleave the analog signal segments based upon the timing of a sample clock operating at a frequency of Fsample.

Various embodiments may be designed to address different technical problems associated with high-speed digital-to-analog conversions. For instance, many embodiments may be designed to address the speed with which the digital-to-analog conversions can be performed. The technical problem of the speed with which the digital-to-analog conversions can be performed may involve problems arising from high clock speeds, non-linearities output by the digital-to-analog converter in switching between conversions, and the like.

Different technical problems such as those discussed above may be addressed by one or more different embodiments. For instance, some embodiments that are designed to address the speed with which the digital-to-analog conversions can be performed may do so by one or more different technical means such as incorporating a number of digital-to-analog converters coupled in parallel to operate concurrently. Some embodiments may include logic to latch the outputs of the digital-to-analog converters to the inputs of the interleaver near or at the end of clock cycles to attenuate the non-linearities associated with switching inputs of the digital-to-analog converters.

Some embodiments may take advantage of Wireless Fidelity (Wi-Fi) network ubiquity, enabling new applications that often require very low power consumption, among other unique characteristics. Wi-Fi generally refers to devices that implement the IEEE 802.11-2007, IEEE Standard for Information technology—Telecommunications and information exchange between systems—Local and metropolitan area networks—Specific requirements—Part 11: Wireless LAN Medium Access Control (MAC) and Physical Layer (PHY) Specifications (http://standards.ieee.org/getieee802/download/802.11-2007 pdf) and other related wireless standards.

Several embodiments comprise access points (APs), stations (STAs), routers, switches, servers, workstations, netbooks, mobile devices (Laptop, Smart Phone, Tablet, and the like), as well as sensors, meters, controls, instruments, monitors, appliances, and the like. Some embodiments may provide, e.g., indoor and/or outdoor "smart" grid and sensor services. For example, some embodiments may provide a metering station to collect data from sensors that meter the usage of electricity, water, gas, and/or other utilities for a home or homes within a particular area. Further embodiments may collect data from sensors for home healthcare, clinics, or hospitals for monitoring healthcare related events and vital signs for patients such as fall detection, pill bottle monitoring, weight monitoring, sleep apnea, blood sugar levels, heart rhythms, and the like.

Logic, modules, devices, and interfaces herein described may perform functions that may be implemented in hardware and/or code. Hardware and/or code may comprise software, firmware, microcode, processors, state machines, chipsets, or combinations thereof designed to accomplish the functionality.

Embodiments may facilitate wireless communications. Some embodiments may comprise wireless communications like Bluetooth®, wireless local area networks (WLANs), wireless metropolitan area networks (WMANs), wireless personal area networks (WPAN), cellular networks, communications in networks, messaging systems, and smart-devices to facilitate interaction between such devices. Furthermore, some wireless embodiments may incorporate a single antenna while other embodiments may employ multiple antennas. For instance, multiple-input and multiple-output (MIMO) is the use of radio channels carrying signals via multiple antennas at both the transmitter and receiver to improve communication performance.

While some of the specific embodiments described below will reference the embodiments with specific configurations, those of skill in the art will realize that embodiments of the present disclosure may advantageously be implemented with other configurations with similar issues or problems.

Turning now to FIG. 1, there is shown an embodiment of a communication system 1000. The communication system 1000 comprises a communications device 1010 that may be wired and/or wirelessly connected to a network 1005. The communications device 1010 may communicate with a plurality of communication devices 1030, 1050, and 1055 via the network 1005. The communications device 1010 may comprise a router for, e.g., a residential network. The communications device 1030 may comprise a communications device such as a station, a consumer electronics device, a personal computing device, or the like. And communications devices 1050 and 1055 may comprise sensors, stations, access points, hubs, switches, routers, computers, laptops, netbooks, cellular phones, smart phones, PDAs (Personal Digital Assistants), or other network-capable devices. Thus, communications devices may be mobile or fixed. For example, the communications device 1010 may comprise a router for a neighborhood of homes. Each of the homes within the neighborhood may comprise a local network comprising one or more computer systems such as the communications device 1030.

In further embodiments, the communications device 1010 may facilitate data offloading. For example, communications devices that are low power sensors may include a data offloading scheme to, e.g., communicate via Wi-Fi, another communications device, a cellular network, or the like for the purposes of reducing power consumption consumed in waiting for access to, e.g., a metering station and/or increasing availability of bandwidth. Communications devices that receive data from sensors such as metering stations may include a data offloading scheme to, e.g., communicate via Wi-Fi, another communications device, a cellular network, or the like for the purposes of reducing congestion of the network 1005.

The network 1005 may represent an interconnection of a number of networks. For instance, the network 1005 may couple with a wide area network such as the Internet or an intranet and may interconnect local devices wired or wirelessly interconnected via one or more hubs, routers, or switches. In the present embodiment, network 1005 communicatively couples communications devices 1010, 1030, 1050, and 1055.

The communication devices 1010 and 1030 comprise memory 1011 and 1031, and MAC sublayer logic 1018 and 1038, respectively. The memory 1011 and 1031 may comprise a storage medium such as Dynamic Random Access Memory (DRAM), read only memory (ROM), buffers, registers, cache, flash memory, hard disk drives, solid-state drives, or the like. The memory 1011 and 1031 may store the frames such as the management, control, and data frames and/or the frame structures. In many embodiments, the memory 1011 and 1031 may store the frames comprising fields based upon the structure of the standard frame structures identified in IEEE 802.11.

The MAC sublayer logic 1018, 1038 may comprise logic to implement functionality of the MAC sublayer of the data link layer of the communications device 1010, 1030. The MAC sublayer logic 1018, 1038 may generate the frames such as management frames, data frames, and control frames, and may communicate with the PHY logic 1019, 1039 to transmit the frames. The PHY logic 1019, 1039 may generate physical layer protocol data units (PPDUs) based upon the frames. More specifically, frame builders may generate the frames and data unit builders of the PHY logic may encapsulate the frames with preambles to generate PPDUs for transmission via a physical layer device such as the transceivers (RX/TX) 1020 and 1040.

The communications devices 1010, 1030, 1050, and 1055 may each comprise a transceiver such as transceivers 1020 and 1040. Each transceiver 1020, 1040 comprises a transmitter and a receiver. Each transmitter impresses digital data onto a frequency for transmission of the data. A receiver receives the transmission at the frequency and extracts the digital data therefrom.

In some embodiments, transceivers 1020 and 1040 implement orthogonal frequency-division multiplexing (OFDM). OFDM is a method of encoding digital data on multiple carrier frequencies. OFDM is a frequency-division multiplexing scheme used as a digital multi-carrier modulation method. A large number of closely spaced orthogonal subcarrier signals are used to carry data. The data is divided into several parallel data streams or channels, one for each subcarrier. Each sub-carrier is modulated with a modulation scheme at a low symbol rate, maintaining total data rates similar to conventional single-carrier modulation schemes in the same bandwidth.

An OFDM system uses several carriers, or "tones," for functions including data, pilot, guard, and nulling. Data tones are used to transfer information between the transmitter and receiver via one of the channels. Pilot tones are used to maintain the channels, and may provide information about time/frequency and channel tracking. Guard tones may be inserted between symbols such as the short training field (STF) and long training field (LTF) symbols during transmission to avoid inter-symbol interference (ISI), which might result from multi-path distortion. These guard tones also help the signal conform to a spectral mask. The nulling of the direct component (DC) may be used to simplify direct conversion receiver designs.

The transceivers 1020 and 1040 may comprise high-speed digital-to-analog converters (DACs) 1025 and 1045, respectively. The high-speed DACs 1025, 1045 may offer high-speed conversions by implementing multiple sub-DACs that operate concurrently to perform digital-to-analog conversions of segments of the digital signal in sequence such that the analog signal can be generated by interleaving the outputs of each of the sub-DACs. Such embodiments facilitate a reduced clock speed for performance of the digital-to-analog conversions. For example, by utilizing N sub-DACs to perform portions or segments of the digital-to-analog conversions, the clock speed of the clock for clocking the sub-DACs can be reduced to the frequency of the samples, Fsample, divided by N (i.e., Fsample/N).

The outputs of the sub-DACs may then be combined to form an analog signal. In many embodiments, interleaving the analog signal segments at a clock speed of a sample clock, e.g., Fsample, may combine the outputs of the sub-DACs to form an analog signal. It should be noted that switching the outputs of the sub-DACs introduces non-linearities into the outputs of the DACs so some embodiments wait a period of time after the switching event before the outputs of the sub-DACs are interleaved into the analog signal. Several embodiments may wait until the end of the clock cycle for the output of the sub-DACs to latch the output of the sub-DACs to the output of the interleaver.

FIG. 1 may depict a number of different embodiments including a Multiple-Input, Multiple-Output (MIMO) system with, e.g., four spatial streams, and may depict degenerate systems in which one or more of the communications devices 1010, 1030, 1050, and 1055 comprise a receiver and/or a transmitter with a single antenna including a Single-Input, Single Output (SISO) system, a Single-Input, Multiple Output (SIMO) system, and a Multiple-Input, Single Output (MISO) system.

Figure 1A:
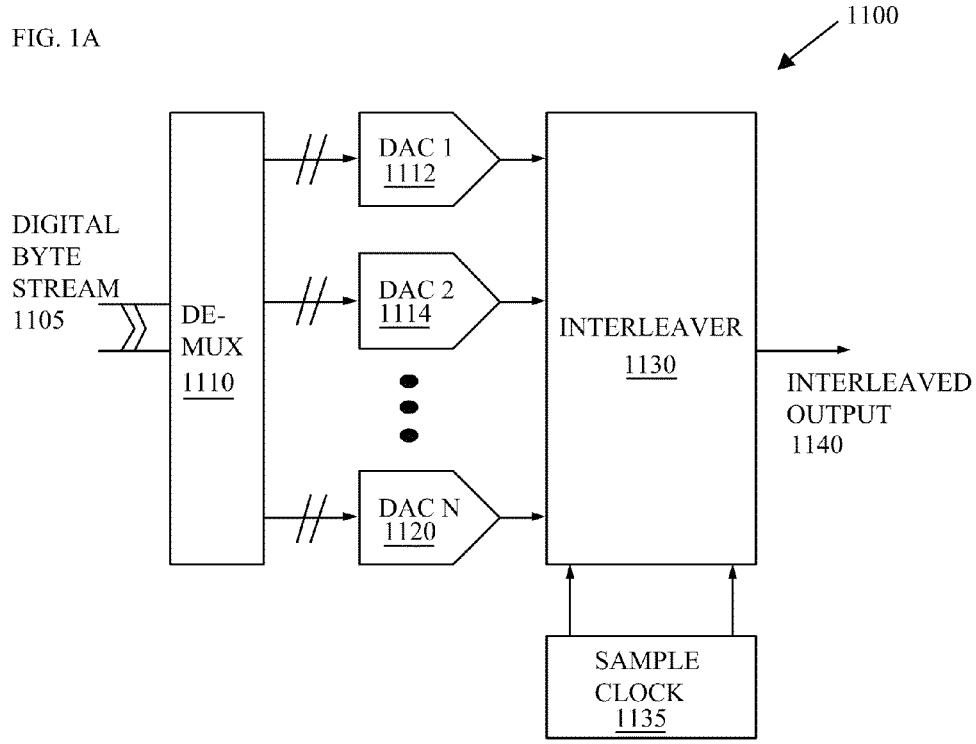
FIG. 1A depicts an embodiment of an apparatus for the high-speed digital-to-analog converter illustrated in FIG. 1.

FIG. 1A depicts an embodiment of an apparatus 1100 for the high-speed digital-to-analog converters (DACs) 1025, 1045 illustrated in FIG. 1. Many embodiments have been developed to facilitate implementation of very high speed DACs as are required, for example, in communication systems. Several embodiments may be particularly advantageous for wide channel bandwidths as are applied in, for example, home networking solutions.

The apparatus 1100 implements time interleaving to increase the digital-to-analog conversion speed without the significant corresponding increases in clock speed. In such embodiments, the time interleaved DAC may comprise N sub-DACs as illustrated in FIG. 1A. Note that these embodiments are not limited to a specific DAC implementation. Further embodiments may implement composite DAC architectures containing, for example, Most Significant Byte (MSB) and Least Significant Byte (LSB) sub-DACs. In other embodiments, the number of bits representing a segment of the signal may be any number of one or more bits.

The apparatus 1100 comprises a de-multiplexer 1110; sub-DACs DAC 1 1112, and DAC 2 1114 through DAC N 1120; an interleaver 1130, and a sample clock 1135. The de-multiplexer 1110 may receive a digital byte stream 1105 at an input of the de-multiplexer 1110. In other embodiments, the de-multiplexer 1110 may receive sets of bits in sequence in a data stream that may not be grouped in bytes. The de-multiplexer 1110 may distribute the sets of bits in segments to the DACs 1 1112 through DAC N 1120 via outputs of the de-multiplexer 1110.

The de-multiplexer 1110 may distribute the sets of bits to the DACs 1112-1120 in any manner. Many embodiments, distribute the sets of bits equally amongst the DACs 1112-1120 to simplify the interleaving of the outputs of the DACs although other, unequal distributions may be implemented in other embodiments.

In the present embodiment, the de-multiplexer 1110 may distribute the sets of bits or bytes to DAC 1 1112 through DAC N 1120 in, e.g., a round robin procedure, to provide parallel or at least concurrent processing of the sets of bits. This architecture may allow most of the implementation to run at a low frequency, i.e., at Fsample/N, where Fsample is the final output sample rate. In many embodiments, the only part of the high-speed DAC running at Fsample may be the interleaver 1130.

The DAC 1 1112 through DAC N 1120 may represent any number of two or more digital segments, or sets of bits. For instance, N may equal eight such that eight segments of the digital representation of the signal may be distributed amongst eight sub-DACs to perform the eight digital-to-analog conversions concurrently.

The outputs of the DAC 1112 through DAC 1120 couple with the inputs of the interleaver 1130. The interleaver 1130 may switch the analog segments at the outputs of the DACs 1112 through 1120 to the interleaved output 1140 based upon timing provided by the sample clock 1135. In many embodiments, the interleaver 1130 may latch the analog segment of a DAC near or at the end of a clock cycle used for switching the output of the DAC to output a digital-to-analog conversion of a subsequent analog segment.

The sample clock 1135 may provide a switching frequency for latching the outputs of the DACs 1112-1120 to the interleaved output 1140. In some embodiments, the sample clock may oscillate at a frequency of Fsample. In other embodiments, the sample clock 1135 may output N phases and provide a clock speed of Fsample/N. In such embodiments, the DACs may each be associated with a different phase of the sample clock 1135. Further embodiments may implement multiple delay elements or buffers to produce multiple phases of the sample clock for triggering the latching of outputs of the DACs 1112-1120 to the interleaved output 1140.

Figure 1B:
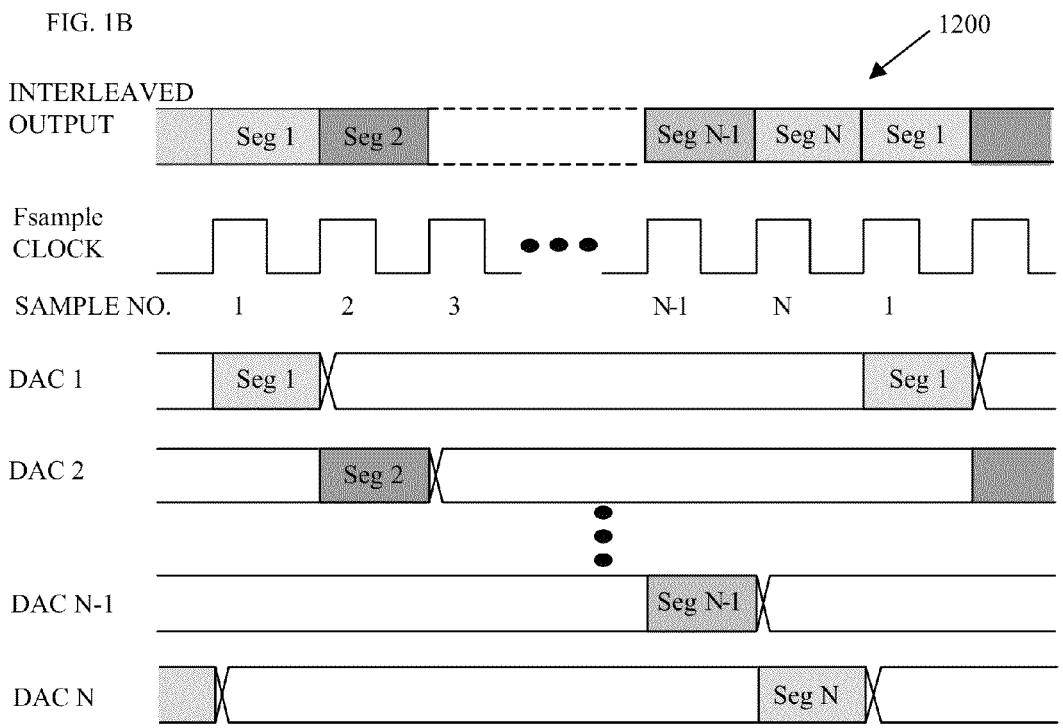
FIG. 1B depicts an embodiment of a timing diagram for the high-speed digital-to-analog converter illustrated in FIG. 1A.

FIG. 1B depicts an embodiment of a timing diagram 1200 for the high-speed digital-to-analog converter 1100 illustrated in FIG. 1A. The timing diagram 1200 illustrates the interleaved output 1140 in the first row comprising N segments per cycle (Seg 1 through Seg N). The Fsample clock signal from the sample clock 1140 is illustrated in the second row and each sample is numbered 1 through N. Note that the timing diagram 1200 illustrates the latching of the analog segments output from the DACs 1112-1120 at the rising edge of the clock signal. Other embodiments may trigger the latching of the analog segments to the interleaved output 1140 at the falling edge of the Fsample clock signal. Still other embodiments may utilize both the rising and falling edges of the clock signal to trigger latching of the analog segments to the interleaved output 1140.

The rows DAC 1, DAC 2, DACN-1, and DAC N illustrate the switching occurring at the output of the DACs as well as the timing for latching the outputs of each of the sub-DACs to the interleaved output 1140. In particular, the row for DAC 1 illustrates the analog segment 1 that is latched to the interleaved output 1140 at the end of the clock cycle, i.e., just before the output is switched to a new output for a subsequent digital input. Similarly, DACs 2 through N illustrate the analog segments (Seg 2, Seg N−1, and Seg N) being latched to the interleaved output 1140. The interleaver 1130 is arranged such that segment 1 output is switched to the interleaved output 1140 during a first Fsample period, then segment 2 in a second Fsample period and so on up through segment N during the Nth Fsample period. Each sub-DAC updates their respective output at a rate of Fsample/N. Note that the physical ordering or layout of the DACs 1112-1120 may or may not have an impact on assignment of segments to the DACs 1112-1120 in various embodiments.

In many embodiments, the output of the sub-DACs are latched to the interleaved output 1140 at or near the end of the clock cycles for the respective sub-DACs to allow the transitory signals or non-linearites in the outputs of the analog segments to attenuate before latching the analog segments to the interleaved output 1140. In other words, each analog segment is updated in the cycle immediately following the output selection cycle. For instance, for segment 1, the output update is instigated in the second Fsample period. For segment 2, the output update is instigated in the 3rd Fsample period and so on. With this timing arrangement, the sub-DACs analog segment outputs each have N−1 Fsample cycles to settle to the set value. Allowing the analog outputs to settle reduces the transitory signals or non-linearities in the analog segments and, thus, reduces the transitory signals and non-linearities in the interleaved output 1140. Reducing the transitory signals and non-linearities in the interleaved output 1140 reduces the extent of filtering that may be implemented on the interleaved output 1140 in some embodiments.

The cycle illustrated in the timing diagram 1200 is repeated to build up a sequence of samples at a rate of Fsample with each segment being updated at a rate of Fsample/N. It should be noted that while the timing diagram 1200 illustrates the segment output update instigated in the cycle immediately following the read cycles, other phasing arrangements could be applied.

Figure 2:
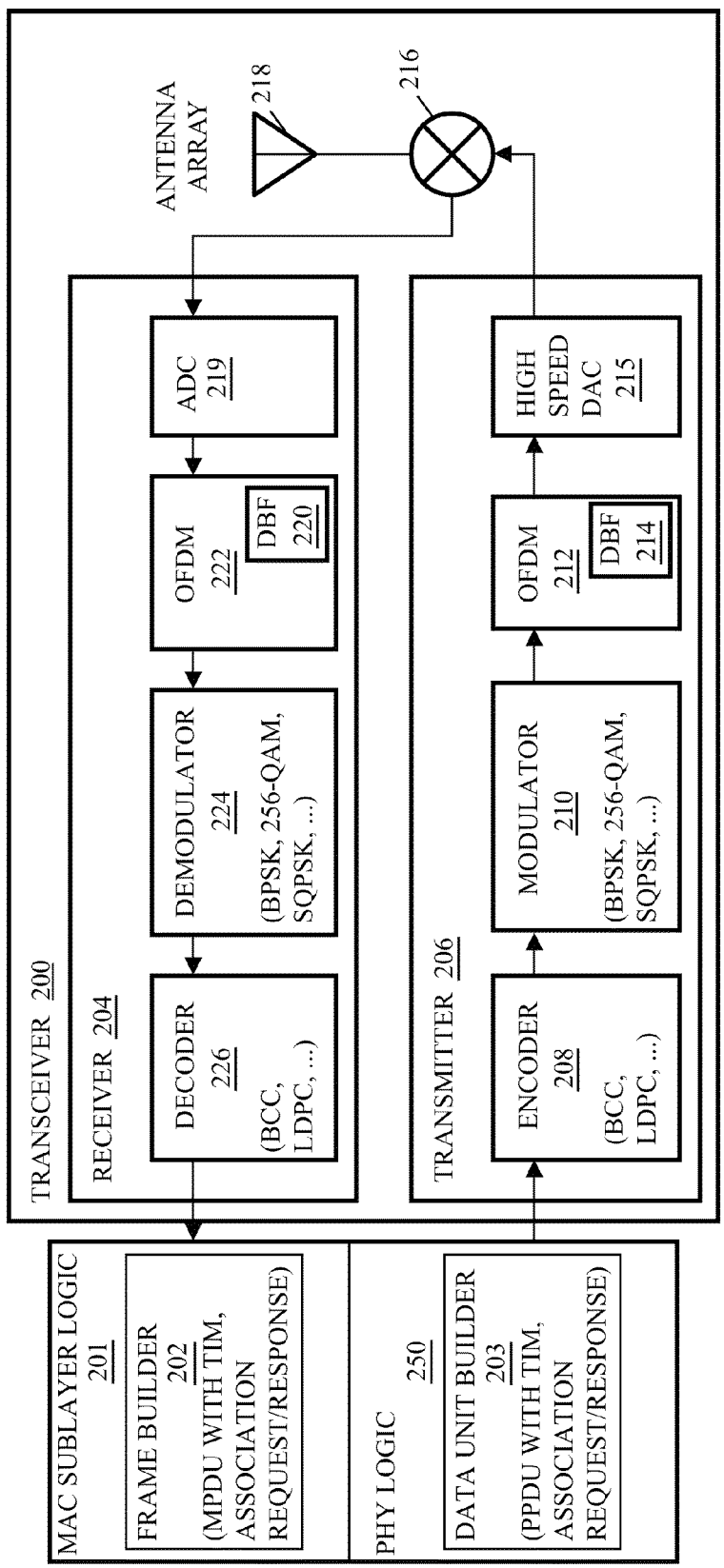
FIG. 2 depicts an embodiment of an apparatus for high-speed digital to analog conversion of signals.

FIG. 2 depicts an embodiment of an apparatus to generate, communicate, transmit, receive, communicate, and interpret a frame with high-speed digital-to-analog conversion of signals. The apparatus comprises a transceiver 200 coupled with medium access control (MAC) sublayer logic 201. The MAC sublayer logic 201 may determine a frame such as an association request frame, an association response frame, or a beacon frame, and transmit the frame to the physical layer (PHY) logic 250. The PHY logic 250 may determine the PPDU by determining a preamble and encapsulating the frame with a preamble to transmit via transceiver 200.

In many embodiments, the MAC sublayer logic 201 may comprise a frame builder 202 to generate frames (MPDUs). For embodiments such as communications devices that associate with an access point, the MAC sublayer logic 201 may generate an association request that includes fields descriptive of capabilities of the communications device. The MAC sublayer logic 201 may then receive and parse and interpret an association response frame.

The PHY logic 250 may comprise a data unit builder 203. The data unit builder 203 may determine a preamble and the PHY logic 250 may encapsulate the MPDU with the preamble to generate a PPDU. In many embodiments, the data unit builder 203 may create the preamble based upon communications parameters chosen through interaction with a destination communications device.

The transceiver 200 comprises a receiver 204 and a transmitter 206. The transmitter 206 may comprise one or more of an encoder 208, a modulator 210, an OFDM 212, a DBF 214, and a high-speed DAC 215. The encoder 208 of transmitter 206 receives and encodes data destined for transmission from the MAC sublayer logic 202 with, e.g., a binary convolutional coding (BCC), a low density parity check coding (LDPC), and/or the like. The modulator 210 may receive data from encoder 208 and may impress the received data blocks onto a sinusoid of a selected frequency via, e.g., mapping the data blocks into a corresponding set of discrete amplitudes of the sinusoid, or a set of discrete phases of the sinusoid, or a set of discrete frequency shifts relative to the frequency of the sinusoid. The output of modulator 210 is fed to an orthogonal frequency division multiplexer (OFDM) 212, which impresses the modulated data from modulator 210 onto a plurality of orthogonal sub-carriers. And, the OFDM 212 may comprise the digital beam former (DBF) 214 to form a plurality of spatial channels and steer each spatial channel independently to maximize the signal power transmitted to and received from each of a plurality of user terminals.

The high-speed DAC 215 may receive a data stream from the OFDM 212 and convert the data stream to an analog signal for transmission via the antenna array 218. More specifically, the high-speed DAC 215 may receive a data stream at an input of a de-multiplexer and de-multiplex the data stream into a sequence of sets of bits. The de-multiplexer may distribute the sets of bits to multiple sub-DACs to convert the digital representation of a signal segment by a set of bits into an analog signal segment. For instance, the data stream may comprise sets of bits as digital representations of magnitudes of the analog signal. The sub-DACs may convert the sets of bits into the corresponding analog signal magnitudes and the signal magnitudes may be interleaved in time segments to generate an analog signal. In further embodiments, the analog filter output from the interleaver may be filtered to smooth out the analog signal.

The transceiver 200 may also comprise diplexers 216 connected to antenna array 218. Thus, in this embodiment, a single antenna array is used for both transmission and reception. When transmitting, the signal passes through diplexers 216 and drives the antenna with the up-converted information-bearing signal. During transmission, the diplexers 216 prevent the signals to be transmitted from entering receiver 204. When receiving, information bearing signals received by the antenna array pass through diplexers 216 to deliver the signal from the antenna array to receiver 204. The diplexers 216 then prevent the received signals from entering transmitter 206. Thus, diplexers 216 operate as switches to alternately connect the antenna array elements to the receiver 204 and the transmitter 206.

The antenna array 218 radiates the information bearing signals into a time-varying, spatial distribution of electromagnetic energy that can be received by an antenna of a receiver. The receiver can then extract the information of the received signal.

The transceiver 200 may comprise a receiver 204 for reception, analog-to-digital conversion, demodulation, and decoding of information bearing signals. The receiver 204 may comprise one or more of an (analog-to-digital converter) ADC 219, a DBF 220, an OFDM 222, a demodulator 224 and a decoder 226. The received signals are fed from antenna elements 218, converted from analog to digital, and fed to a Digital Beam Former (DBF) 220. The DBF 220 transforms N antenna signals into L information signals. The output of the DBF 220 is fed to the OFDM 222. The OFDM 222 extracts signal information from the plurality of subcarriers onto which information-bearing signals are modulated. The demodulator 224 demodulates the received signal, extracting information content from the received signal to produce an un-demodulated information signal. And, the decoder 226 decodes the received data from the demodulator 224 and transmits the decoded information, the MPDU, to the MAC sublayer logic 201.

After receiving a frame, the MAC sublayer logic 201 may access frame structures in memory to parse the frame.

Persons of skill in the art will recognize that a transceiver may comprise numerous additional functions not shown in FIG. 2 and that the receiver 204 and transmitter 206 can be distinct devices rather than being packaged as one transceiver. For instance, embodiments of a transceiver may comprise a Dynamic Random Access Memory (DRAM), a reference oscillator, filtering circuitry, synchronization circuitry, an interleaver and a deinterleaver, possibly multiple frequency conversion stages and multiple amplification stages, etc. Further, some of the functions shown in FIG. 2 may be integrated. For example, digital beam forming may be integrated with orthogonal frequency division multiplexing. In some embodiments, for instance, the transceiver 200 may comprise one or more processors and memory including code to perform functions of the transmitter 206 and/or receiver 204.

Figure 3:
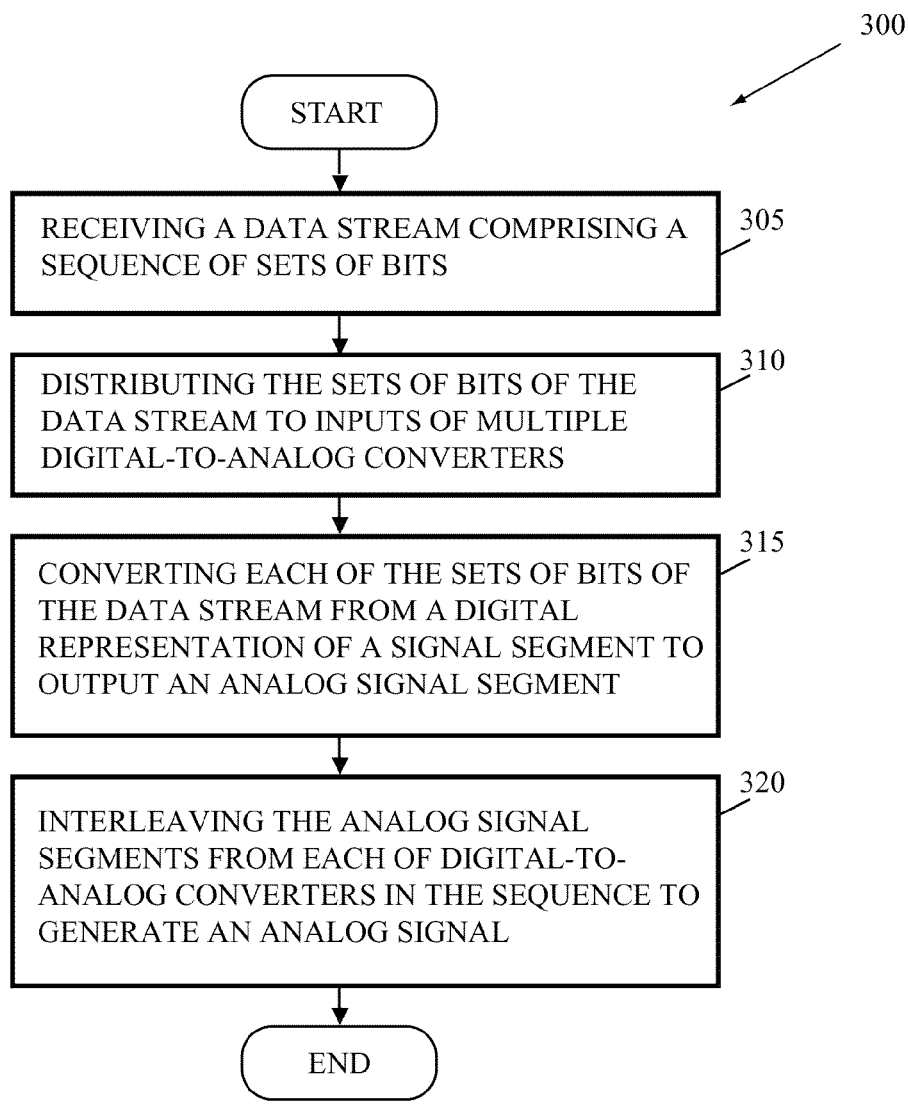
FIG. 3 depicts an embodiment of a flowchart for high-speed digital to analog conversion of signals as illustrated in FIG. 1A.

FIG. 3 depicts an embodiment of a flowchart 300 for high-speed digital-to-analog conversion of signals. The flowchart 300 begins with receiving a data stream, wherein the data stream comprises the sequence of the sets of bits (element 305). In some embodiments, receiving the data stream comprises receiving digital representations of magnitudes of the analog signal. In one embodiment, the flowchart 300 comprises receiving the data stream as a digital byte stream. For instance, the flowchart 300 may begin with receiving digital representations of an analog signal wherein the bytes of the data stream are describe characteristics of the analog signal that can be converted via digital-to-analog converters.

Many embodiments receive the data stream at an element designed to distribute sets of bits from the data stream to multiple digital-to-analog converters (DACs) (element 310) also referred to herein as sub-DACs since each of the sub-DACs is designed to convert a portion of the data stream. In some embodiments, distributing the sequence of sets of bits comprises de-multiplexing the data stream. In several embodiments, distributing the sequence of sets of bits comprises distributing, e.g., N sets of bits to the inputs of N digital-to-analog converters, wherein N may be any number of two or more such as eight, twelve, 21, any number between two and 100, etc. Furthermore, the sets of bits may comprise any number of bits designed for the inputs of the sub-DACs such as four bits, eight bits, 15 bits, 30 bits, any number between two and 100, etc. The number of bits may represent the granularity of the representation of the magnitudes of the analog signal segments to interweave to for the analog signal.

After distributing the sets of bits of the data stream to the DACs, many embodiments may comprise converting each of the sets of bits from a digital representation of a signal segment to output an analog signal segment (element 315). In some embodiments, converting each of the sets comprises converting a set of bits from a digital representation of a signal segment to an analog signal segment, or an analog representation of the signal segment, having a magnitude represented by the set of bits. In many embodiments, the data stream is de-multiplexed into the sets of bits at the outputs of, e.g., a de-multiplexer (de-mux). The outputs of the de-mux may be coupled in parallel with inputs of a number of sub-DACs to transmit, e.g., a cycle or a portion of a cycle of the signal represented by the sets of bits to the sub-DACs. For instance, in some embodiments, the sets of bits may represent a quarter of a cycle of an analog signal and each of the sub-DACs may receive the sets of bits from the de-mux in an evenly distributed manner to facilitate concurrent digital-to-analog conversions of the sets of bits. In other embodiments, the sets of bits distributed to the sub-DACs may represent an eighth of a cycle, a third of a cycle, two cycles, five cycles, or the like. In further embodiments, the pattern of distribution may be other than even and based upon, e.g., another particular pattern that is accounted for in the interleaver.

After converting the sets of bits, the DACs may apply corresponding analog segments to the outputs of the DACs. The outputs of the DACs may couple with inputs of an interleaver to facilitate interleaving the analog signal segments from each of digital-to-analog converters in the sequence to generate an analog signal, or analog representation of the data stream (element 320). In several embodiments, interleaving the analog signal segments comprises applying magnitudes of each of the analog signal segments to an interleaved output in the sequence. In further embodiments, interleaving the analog signal segments comprises latching magnitudes of each of the analog signal segments to an interleaved output near ends of clock cycles to attenuate non-linearities in the magnitudes of each of the analog signal segments when the magnitudes are output.

The following examples pertain to further embodiments. One example comprises a method. The method may involve distributing a sequence of sets of bits to inputs of multiple digital-to-analog converters; converting each of the sets of bits from a digital representation of a signal segment to output an analog signal segment; and interleaving the analog signal segments from each of digital-to-analog converters in the sequence to generate an analog signal.

In some embodiments, the method may further comprise receiving a data stream, wherein the data stream comprises the sequence of the sets of bits. The method may comprise receiving the data stream comprises receiving digital representations of magnitudes of the analog signal. In further embodiments, distributing the sequence of sets of bits comprises de-multiplexing the data stream. In some embodiments, distributing the sequence of sets of bits comprises distributing eight sets of bits to the inputs of eight digital-to-analog converters. In some embodiments, converting each of the sets comprises converting a set of bits to an analog signal segment having a magnitude represented by the set of bits. In some embodiments, interleaving the analog signal segments comprises applying magnitudes of each of the analog signal segments to an interleaved output in the sequence. In some embodiments, interleaving the analog signal segments comprises latching magnitudes of each of the analog signal segments to an interleaved output near ends of clock cycles to attenuate non-linearities in the magnitudes of each of the analog signal segments when the magnitudes are output.

At least one computer program product for communication of a packet with a short frame, the computer program product comprising a computer useable medium having a computer useable program code embodied therewith, the computer useable program code comprising computer useable program code configured to perform operations, the operations to carry out a method according to any one or more or all of embodiments of the method described above.

At least one system comprising hardware and code may carry out a method according to any one or more or all of embodiments of the method described above.

Another example comprises an apparatus. The apparatus may comprise a de-multiplexer to distribute a sequence of sets of bits to inputs of multiple digital-to-analog converters; digital-to-analog converters to operate concurrently to convert the sets of bits from digital representations of signal segments to output analog signal segments; and an interleaver to interleave the analog signal segments from each of digital-to-analog converters in the sequence to generate an analog signal.

In some embodiments, the apparatus may further comprise an antenna to transmit the analog signal. In some embodiments, the apparatus may further comprise a sample clock coupled with the interleaver to clock latching the outputs of the digital-to-analog converters at the inputs of the interleaver. In further embodiments, the de-multiplexer comprises an input to receive a data stream, wherein the data stream comprises the sequence of the sets of bits. In some embodiments, the data stream comprises digital representations of magnitudes of the analog signal. In some embodiments, the digital-to-analog converters comprise inputs to receive eight sets of bits to the inputs of eight digital-to-analog converters. In some embodiments, the digital-to-analog converters are adapted to operate in parallel to convert the sets of bits from digital representations of signal segments to output analog signal segments. In some embodiments, the interleaver is adapted to interleave the analog signal segments by applying magnitudes of each of the analog signal segments to an interleaved output in the sequence at a frequency of a sample clock. In further embodiments, the interleaver is adapted to interleave the analog signal segments by latching magnitudes of each of the analog signal segments to an interleaved output near ends of clock cycles to attenuate non-linearities in the magnitudes of each of the analog signal segments when the magnitudes are output.

Another example comprises a system. The system may comprise at least one system comprising the apparatus according to any one or more of or all of the elements above and comprising an antenna coupled with the physical layer logic to transmit the frame. The system may further comprise memory to store at least part of the frame.

Another example comprises a system. The system may comprise an antenna; and a transmitter coupled with the antenna, the transmitter comprising: a de-multiplexer to distribute a sequence of sets of bits to inputs of multiple digital-to-analog converters; digital-to-analog converters to operate in parallel to convert the sets of bits from digital representations of signal segments to output analog signal segments;

and an interleaver to interleave the analog signal segments from each of digital-to-analog converters in the sequence to generate an analog signal.

In several embodiments, the antenna comprises an antenna array and the system further comprises a receiver to receive a wireless communication via the antenna array. Some embodiments may further comprise a sample clock coupled with the interleaver to clock latching the outputs of the digital-to-analog converters at the inputs of the interleaver. In some embodiments, the de-multiplexer comprises an input to receive a data stream, wherein the data stream comprises the sequence of the sets of bits. In further embodiments, the data stream comprises digital representations of magnitudes of the analog signal. In several embodiments, the digital-to-analog converters comprise inputs to receive eight sets of bits to the inputs of eight digital-to-analog converters. In many embodiments, the digital-to-analog converters are adapted to operate in parallel to convert the sets of bits from digital representations of signal segments to output analog signal segments. In several embodiments, the interleaver is adapted to interleave the analog signal segments by applying magnitudes of each of the analog signal segments to an interleaved output in the sequence at a frequency of a sample clock. In some embodiments, the interleaver is adapted to interleave the analog signal segments by latching magnitudes of each of the analog signal segments to an interleaved output near ends of clock cycles to attenuate non-linearities in the magnitudes of each of the analog signal segments when the magnitudes are output.

In some embodiments, some or all of the features described above and in the claims may be implemented in one embodiment. For instance, alternative features may be implemented as alternatives in an embodiment along with logic or selectable preference to determine which alternative to implement. Some embodiments with features that are not mutually exclusive may also include logic or a selectable preference to activate or deactivate one or more of the features. For instance, some features may be selected at the time of manufacture by including or removing a circuit pathway or transistor. Further features may be selected at the time of deployment or after deployment via logic or a selectable preference such as a dipswitch or the like. A user after via a selectable preference such as a software preference, a dipswitch, or the like may select still further features.

Another embodiment is implemented as a program product for implementing systems, apparatuses, and methods described with reference to FIGS. 1-3. Embodiments can take the form of an entirely hardware embodiment, a software embodiment implemented via general purpose hardware such as one or more processors and memory, or an embodiment containing both specific-purpose hardware and software elements. One embodiment is implemented in software or code, which includes but is not limited to firmware, resident software, microcode, or other types of executable instructions.

Furthermore, embodiments can take the form of a computer program product accessible from a machine-accessible, computer-usable, or computer-readable medium providing program code for use by or in connection with a computer, mobile device, or any other instruction execution system. For the purposes of this description, a machine-accessible, computer-usable, or computer-readable medium is any apparatus or article of manufacture that can contain, store, communicate, propagate, or transport the program for use by or in connection with the instruction execution system or apparatus.

The medium may comprise an electronic, magnetic, optical, electromagnetic, or semiconductor system medium. Examples of a machine-accessible, computer-usable, or computer-readable medium include memory such as volatile memory and non-volatile memory. Memory may comprise, e.g., a semiconductor or solid-state memory like flash memory, magnetic tape, a removable computer diskette, a random access memory (RAM), a read-only memory (ROM), a rigid magnetic disk, and/or an optical disk. Current examples of optical disks include compact disk-read only memory (CD-ROM), compact disk-read/write memory (CD-R/W), digital video disk (DVD)-read only memory (DVD-ROM), DVD-random access memory (DVD-RAM), DVD-Recordable memory (DVD-R), and DVD-read/write memory (DVD-R/W).

An instruction execution system suitable for storing and/or executing program code may comprise at least one processor coupled directly or indirectly to memory through a system bus. The memory may comprise local memory employed during actual execution of the code, bulk storage such as dynamic random access memory (DRAM), and cache memories which provide temporary storage of at least some code in order to reduce the number of times code must be retrieved from bulk storage during execution.

Input/output or I/O devices (including but not limited to keyboards, displays, pointing devices, etc.) can be coupled to the instruction execution system either directly or through intervening I/O controllers. Network adapters may also be coupled to the instruction execution system to enable the instruction execution system to become coupled to other instruction execution systems or remote printers or storage devices through intervening private or public networks. Modem, Bluetooth™, Ethernet, Wi-Fi, and WiDi adapter cards are just a few of the currently available types of network adapters.

What is claimed is:

1. A method comprising:
    distributing a sequence of sets of bits to inputs of multiple digital-to-analog converters;
    converting each of the sets of bits from a digital representation of a signal segment to output an analog signal segment; and
    interleaving the analog signal segments from each of digital-to-analog converters in the sequence to generate an analog signal, wherein interleaving the analog signal segments comprises latching magnitudes of each of the analog signal segments to an interleaved output near ends of clock cycles to attenuate non-linearities in the magnitudes of each of the analog signal segments when the magnitudes are output.

2. The method of claim 1, further comprising receiving the data stream, wherein the data stream comprises the sequence of the sets of bits.

3. The method of claim 2, wherein receiving the data stream comprises receiving digital representations of magnitudes of the analog signal.

4. The method of claim 2, wherein distributing the sequence of sets of bits comprises de-multiplexing the data stream and distributing the sequence of sets of bits to a composite digital-to-analog converter (DAC) architecture containing Most Significant Byte (MSB) and Least Significant Byte (LSB) sub-DACs.

5. The method of claim 1, wherein distributing the sequence of sets of bits comprises distributing eight sets of bits to the inputs of eight digital-to-analog converters.

6. The method of claim 1, wherein converting each of the sets comprises converting a set of bits to an analog signal segment having a magnitude represented by the set of bits.

7. The method of claim 1, wherein interleaving the analog signal segments comprises applying magnitudes of each of the analog signal segments to an interleaved output in the sequence.

8. An apparatus comprising:
- a de-multiplexer to distribute a sequence of sets of bits to inputs of multiple digital-to-analog converters;
- digital-to-analog converters to operate in parallel to convert the sets of bits from digital representations of signal segments to output analog signal segments; and
- an interleaver to interleave the analog signal segments from each of digital-to-analog converters in the sequence to generate an analog signal, wherein the interleaver is adapted to latch magnitudes of each of the analog signal segments to an interleaved output near ends of clock cycles to attenuate non-linearities in the magnitudes of each of the analog signal segments when the magnitudes are output.

9. The apparatus of claim 8, further comprising an antenna to transmit the analog signal.

10. The apparatus of claim 8, further comprising a sample clock coupled with the interleaver to clock latching the outputs of the digital-to-analog converters at the inputs of the interleaver.

11. The apparatus of claim 8, wherein the de-multiplexer comprises an input to receive a data stream, wherein the data stream comprises the sequence of the sets of bits.

12. The apparatus of claim 11, wherein the data stream comprises digital representations of magnitudes of the analog signal.

13. The apparatus of claim 11, wherein the digital-to-analog converters comprise inputs to receive eight sets of bits to the inputs of eight digital-to-analog converters.

14. The apparatus of claim 8, wherein the digital-to-analog converters are adapted to operate in parallel to convert the sets of bits from digital representations of signal segments to output analog signal segments.

15. The apparatus of claim 8, wherein the interleaver is adapted to interleave the analog signal segments by applying magnitudes of each of the analog signal segments to an interleaved output in the sequence at a frequency of a sample clock.

16. A system comprising:
- an antenna; and
- a transmitter coupled with the antenna, the transmitter comprising:
  - a de-multiplexer to distribute a sequence of sets of bits to inputs of multiple digital-to-analog converters;
  - digital-to-analog converters to operate in parallel to convert the sets of bits from digital representations of signal segments to output analog signal segments; and
  - an interleaver to interleave the analog signal segments from each of digital-to-analog converters in the sequence to generate an analog signal, wherein the interleaver is adapted to latch magnitudes of each of the analog signal segments to an interleaved output near ends of clock cycles to attenuate non-linearities in the magnitudes of each of the analog signal segments when the magnitudes are output.

17. The system of claim 16, wherein the antenna comprises an antenna array and the system further comprises a receiver to receive a wireless communication via the antenna array.

18. The system of claim 16, further comprising a sample clock coupled with the interleaver to clock latching the outputs of the digital-to-analog converters at the inputs of the interleaver.

19. The system of claim 16, wherein the de-multiplexer comprises an input to receive a data stream, wherein the data stream comprises the sequence of the sets of bits.

20. The system of claim 19, wherein the data stream comprises digital representations of magnitudes of the analog signal.

21. The system of claim 19, wherein the digital-to-analog converters comprise inputs to receive eight sets of bits to the inputs of eight digital-to-analog converters.

22. The system of claim 16, wherein the digital-to-analog converters are adapted to operate in parallel to convert the sets of bits from digital representations of signal segments to output analog signal segments.

23. The system of claim 16, wherein the interleaver is adapted to interleave the analog signal segments by applying magnitudes of each of the analog signal segments to an interleaved output in the sequence at a frequency of a sample clock.

* * * * *